(12) United States Patent
Kondou et al.

(10) Patent No.: US 8,404,894 B2
(45) Date of Patent: Mar. 26, 2013

(54) COMPOUND AND COLOR FILTER

(75) Inventors: Hitoshi Kondou, Chiba (JP); Shougo Yamada, Chiba (JP); Ryousuke Asami, Chiba (JP); Katsunori Shimada, Chiba (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 13/636,888

(22) PCT Filed: Sep. 21, 2011

(86) PCT No.: PCT/JP2011/071459
§ 371 (c)(1),
(2), (4) Date: Sep. 24, 2012

(87) PCT Pub. No.: WO2012/039417
PCT Pub. Date: Mar. 29, 2012

(65) Prior Publication Data
US 2013/0018208 A1    Jan. 17, 2013

(30) Foreign Application Priority Data

Sep. 24, 2010 (JP) ................. 2010-213612

(51) Int. Cl.
*C07C 213/00* (2006.01)
*C07C 215/00* (2006.01)
*C07C 217/00* (2006.01)
*C07C 221/00* (2006.01)
*C07C 223/00* (2006.01)
*C07C 225/00* (2006.01)

(52) U.S. Cl. ..................................... 564/283

(58) Field of Classification Search ........................ None
See application file for complete search history.

(56) References Cited

U.S. PATENT DOCUMENTS
4,142,914 A    3/1979 Bast et al.

FOREIGN PATENT DOCUMENTS

| JP | 53-105531 A | 9/1978 |
| JP | 2001-081348 A | 3/2001 |
| JP | 2010-083912 A | 4/2010 |
| JP | 2010-085444 A | 4/2010 |
| JP | 2010-249869 A | 11/2010 |
| JP | 2011-186043 A | 9/2011 |

*Primary Examiner* — Rosalynd Keys
*Assistant Examiner* — Jennifer C Sawyer
(74) *Attorney, Agent, or Firm* — McDermott Will & Emery LLP

(57) ABSTRACT

There is provided a triarylmethane compound which can provide a colored product that has light resistance equivalent to heretofore available light resistance and that undergoes only a small change in hue over a long period of time even when having a high-temperature heat history. For example, when a blue pixel portion of a color filter is formed, there is provided a triarylmethane compound which can provide a liquid crystal display apparatus or the like that has light resistance equivalent to heretofore available light resistance and that can perform high-brightness liquid crystal display for a long time even at high temperature. There is also provided a color filter containing the triarylmethane compound in the blue pixel portion. In the triarylmethane compound, the counter-anion of a basic triarylmethane dye cation is a heteropolyoxometalate anion represented by $(SiMoW_{11}O_{40})^{4-}/4$. The color filter contains the triarylmethane compound in a blue pixel portion.

4 Claims, 1 Drawing Sheet

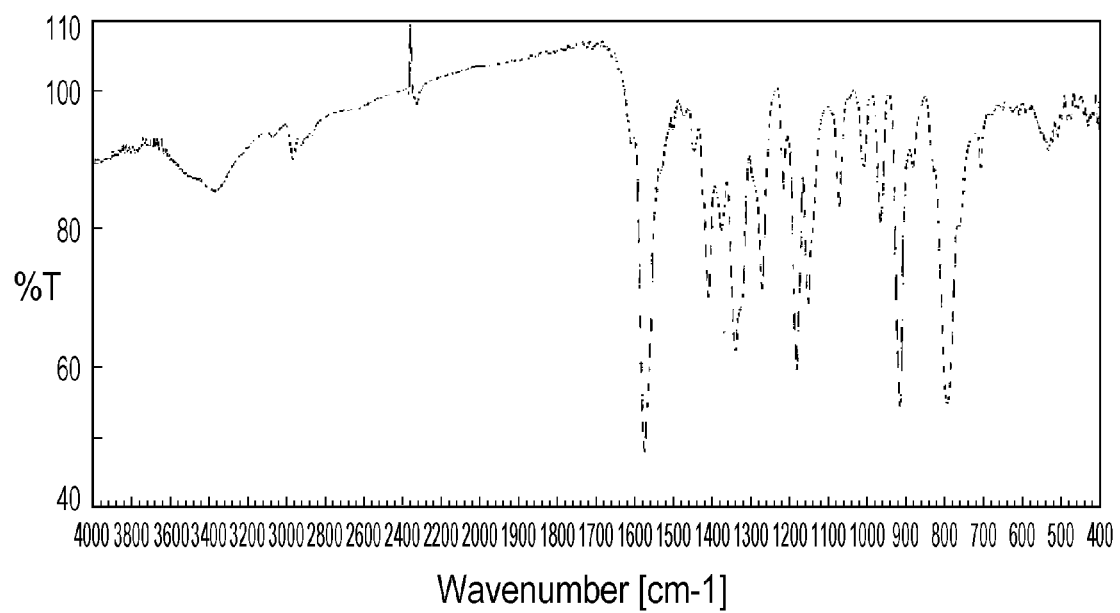

COMPOUND AND COLOR FILTER

CROSS REFERENCE TO PRIOR APPLICATIONS

This application is a U.S. National Phase application under 35 U.S.C. §371 of International Application No. PCT/JP2011/071459, filed on Sep. 21, 2011 and claims benefit of priority to Japanese Patent Application No. 2010-213612, filed on Sep. 24, 2010. The International Application was published in Japanese on Mar. 29, 2012 as WO 2012/039417 A1 under PCT Article 21(2). The contents of the above applications are hereby incorporated by reference.

TECHNICAL FIELD

The present invention relates to a triarylmethane compound which, when used as a coloring agent, can provide a colored product that undergoes only a small change in hue over a long period of time even when having a high-temperature heat history. The present invention also relates to a color filter containing the triarylmethane compound in a blue pixel portion.

BACKGROUND ART

Color filters for liquid crystal display apparatuses or the like include a red pixel portion (R), a green pixel portion (G), and a blue pixel portion (B). These pixel portions each have a structure in which a thin film composed of a synthetic resin containing an organic pigment dispersed therein is formed on a substrate. The organic pigment is an organic pigment for each of red, green, and blue colors.

In these pixel portions, a blue organic pigment for forming the blue pixel portion is generally an ε-copper phthalocyanine pigment (C.I. Pigment Blue 15:6). To adjust the color tone, a dioxazine violet pigment (C, I. Pigment Violet 23), which is a violet organic pigment, may be optionally used together in a small amount.

The organic pigment used when a color filter is produced needs to have characteristics totally different from those of organic pigments for general-purpose applications. Specifically, such an organic pigment needs to provide a brighter display screen of liquid crystal display apparatuses or the like (achieve higher luminance). However, if a dioxazine violet pigment is used together with an ε-copper phthalocyanine pigment, high brightness cannot be achieved. Therefore, achievement of higher brightness is particularly required for an organic pigment used for forming the blue pixel portion (B).

In recent years, it has been considered that a triarylmethane pigment such as C.I. Pigment Blue 1, which is better than the ε-copper phthalocyanine pigment in terms of brightness, is used to form a blue pixel portion of a color filter to achieve higher brightness (PTLs 1 to 3).

A fanal color (FANAL BLUE D6340 and D6390) having the following chemical structure and manufactured by BASF is well-known as C. I. Pigment Blue 1. C. I. Pigment Blue 1 is obtained by forming. Victoria Pure Blue BO, which is a basic triarylmethane dye, into a lake with a heteropoly acid such as phosphomolybdate or phosphotungstomolybdate. In the thus-obtained C.I. Pigment Blue 1, the counterion $X^-$ of the cation is Keggin-type $PMo_xW_{12-x}O_{40}$.

[Chem. 1]

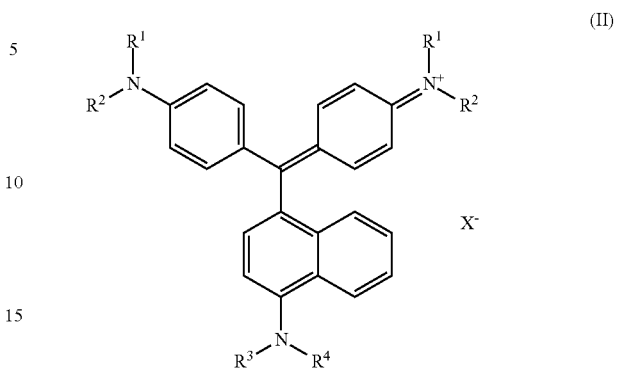

[In general formula (II), $R^1$, $R^2$, and $R^3$ are each an ethyl group; $R^4$ is a hydrogen atom; and $X^-$ is a Keggin-type phosphotungstomolybdate anion or phosphomolybdate anion.]

When these triarylmethane pigments are used to form a blue pixel portion of a color filter, the light resistance can be maintained. However, satisfactory brightness still cannot be maintained for a long time at a high temperature of more than 200° C. As a matter of fact, the heat resistance is not sufficiently high.

CITATION LIST

Patent Literature

PTL 1: Japanese Unexamined Patent Application Publication No. 2001-81348
PTL 2: Japanese Unexamined Patent Application Publication No. 2010-83912
PTL 3: Japanese Unexamined Patent Application Publication No. 2010-85444

SUMMARY OF INVENTION

Technical Problem

It is an object of the present invention to provide a triarylmethane compound which can provide a colored product that has light resistance equivalent to heretofore available light resistance and that undergoes only a small change in hue over a long period of time even when having a high-temperature heat history. For example, when a blue pixel portion of a color filter is formed, there is provided a triarylmethane compound which can provide a liquid crystal display apparatus or the like that has light resistance equivalent to heretofore available light resistance and that can perform high-brightness liquid crystal display for a long time even at high temperature. It is another object of the present invention to provide a color filter containing the triarylmethane compound in the blue pixel portion.

Solution to Problem

As a result of thorough studies conducted in view of the foregoing, the inventors of the present invention have found the following and have completed the present invention. That is, when the triarylmethane compound is a compound in which the counter-anion of a basic triarylmethane dye cation is a specific anion, the light, resistance equal to or higher than heretofore available light resistance is maintained, a small change in the hue of a colored product is selectively achieved, and the heat resistance can be significantly improved.

The present invention provides a compound represented by general formula (I) below.

[Chem. 2]

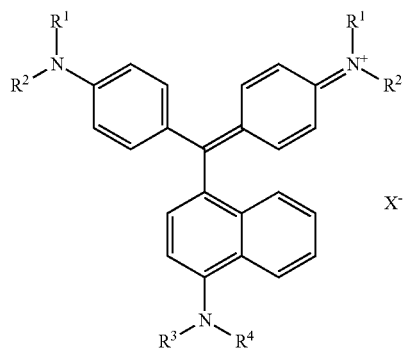

(I)

[In general formula (I), $R^1$, $R^2$, $R^3$, and $R^4$ may be the same or different from each other and are each a hydrogen atom, an alkyl group having 1 to 3 carbon atoms, or a phenyl group; and $X^-$ is a heteropolyoxometalate anion represented by $(SiMoW_{11}O_{40})^{4-}/4$.]

The present invention also provides a color filter containing the compound represented by general formula (I) above in a blue pixel portion.

Advantageous Effects of Invention

Since the triarylmethane compound of the present invention is a triarylmethane compound represented by general formula (I), the triarylmethane compound of the present invention provides exceptional technical advantages in that the light resistance equivalent to heretofore available light resistance is maintained, a small change in the hue of a colored product is selectively achieved, and the heat resistance can be significantly improved. In particular, the light resistance of a color filter of liquid crystal display apparatuses or the like is maintained and the heat resistance for maintaining brightness, can be significantly improved.

Since the color filter of the present invention contains the triarylmethane compound represented by general formula (I) in a blue pixel portion, the color filter provides exceptional technical advantages in that the light resistance equivalent to heretofore available light resistance is maintained and a liquid crystal display apparatus or the like that can display a bright image for a long time can be provided.

BRIEF DESCRIPTION OF DRAWINGS

FIG. 1 shows a Fourier transform infrared absorption spectrum of a triarylmethane compound obtained in Example 1.

DESCRIPTION OF EMBODIMENTS

The triarylmethane compound of the present invention is a compound represented by general formula below.

[Chem. 3]

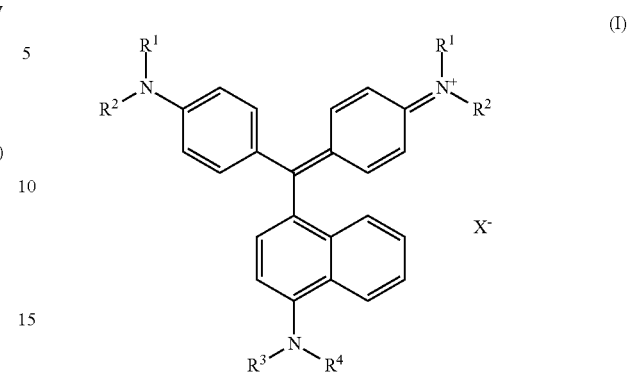

(I)

[In general formula (I), $R^1$, $R^2$, $R^3$, and $R^4$ may be the same or different from each other and are each a hydrogen atom, an alkyl group having 1 to 3 carbon atoms, or a phenyl group; and $X^-$ is a heteropolyoxometalate anion represented by $(SiMoW_{11}O_{40})^{4-}/4$.]

The compound of the present invention represented by general formula (I) is constituted by an anion moiety composed of $X^-$ and a basic triarylmethane dye cation, which is a moiety other than $X^-$. $X^-$ of a publicly known triarylmethane compound is a phosphotungstomolybdate anion or a phosphomolybdate anion whereas $X^-$ of the compound of the present invention is a heteropolyoxometalate anion represented by $(SiMoW_{11}O_{40})^{4-}/4$.

$R^1$, $R^2$, $R^3$, and $R^4$ in the compound of the present invention represented by general formula (I) may be the same or different from each other and are each a hydrogen atom, a methyl group, an ethyl group, an n-propyl group, an iso-propyl group, or a phenyl group.

A preferred structure of the cation moiety is exemplified below. When $R^1$, $R^2$, and $R^3$ on nitrogen atoms are each an ethyl group and $R^4$ is a hydrogen atom, the cation moiety [corresponds to Victoria Pure Blue BO (Basic Blue 7)]. When $R^1$ and $R^2$ on nitrogen atoms are each a methyl group, $R^3$ is a phenyl group, and $R^4$ is a hydrogen atom, the cation moiety [corresponds to Victoria Blue B (Basic Blue 26)] When $R^1$ and $R^2$ on nitrogen atoms are each a methyl group, $R^3$ is an ethyl group, and $R^4$ is a hydrogen atom, the cation moiety [corresponds to Victoria Blue R (Basic Blue 11)]. When $R^1$, $R^2$, and $R^3$ on nitrogen atoms are each a methyl group and $R^4$ is a phenyl group, the cation moiety [corresponds to Victoria Blue 4R (Basic Blue 8)]. The compounds in parentheses represent corresponding dyes whose cation moiety has the same structure. In other words, in view of only these cation structures, they are publicly known as described below.

The compound of the present invention is characterized in that the counter-anion $X^-$ is a specific anion. The anion of the compound of the present invention is a heteropolyoxometalate anion represented by $(SiMoW_{11}O_{40})^{4-}/4$.

Such a heteropoly acid or alkali metal heteropolyoxometalate can be easily produced by a method described in Journal of American Chemical Society, 104 (1982) p 3194. Specifically, an aqueous nitric acid solution and an aqueous alkali, metal molybdate solution are mixed with each other under stirring. $K8(\alpha-SiW_{11}O_{39})$ is added thereto and the mixture is stirred for 2 to 6 hours. By causing the thus-obtained heteropoly acid to react with an alkali metal chloride, a Keggin-type alkali metal heteropolyoxometalate can be obtained in the same manner as that described above.

In the production method of the Keggin-type alkali metal heteropolyoxometalate, when a precipitate is not easily obtained from a reaction solution, the solubility may be decreased by, for example, cooling the reaction solution. Consequently, the Keggin-type alkali metal heteropolyoxometalate can be produced with higher yield.

The compound of the present invention can be easily produced by causing the above-described corresponding dye to react with the above-described corresponding heteropoly acid or alkali metal heteropolyoxometalate. In the case where the dye whose anion is a chloride ion and a heteropoly acid are used, the compound can be produced by a dehydrochlorination reaction. In the case where the dye whose anion is a chloride ion and a metal heteropolyoxometalate are used, the compound can be produced by salt substitution.

Preferably, a heteropoly acid is converted into an alkali metal heteropolyoxometalate and then an alkali metal chloride-removing reaction is performed rather than the dehydrochlorination reaction that uses the heteropoly acid. This is because the salt substitution can be performed with certainty, and a triarylmethane compound of the present invention having high purity with fewer by-products can be produced with higher yield. Obviously, the alkali metal heteropolyoxometalate may be used after being purified through recrystallization or the like.

The cation derived from a dye is a monovalent cation. Therefore, the reaction described above is preferably performed while the number of moles of heteropoly acid or alkali metal heteropolyoxometalate, which is a source of an anion, is adjusted so as to be equal to that of the cation in accordance with the ionic valence.

The triarylmethane compound of the present invention is produced by a method including a step of forming a lake (water-insolubilizing the cation) with a heteropoly acid (or the cation has been formed into a lake (water-insolubilized) with a heteropoly acid). Therefore, in the case where water is used during or after the production process, water containing metal ions and halogen ions in an amount as small as possible, such as purified water, ion exchanged water, or pure water, is preferably used in order to cause the reaction with certainty and prevent the destruction of the lake structure of a compound to be produced.

The triarylmethane compound of the present invention has a structure in which a publicly known cation structure and a publicly known anion structure are combined with each other. Thus, by confirming that both the cation structure and anion structure are contained in the product obtained by the above-described production method, the identification can be easily made. By measuring the infrared absorption spectrum of the product, it is confirmed that the structures of the raw materials used for the reaction are left. Furthermore, since the product does not contain an anion of the dye or a cation of the heteropolyoxometalate in the raw materials used for the reaction, the progress of the lake-forming reaction can be confirmed using X-ray fluorescence analysis through a decrease in the intensities of peaks that are intrinsic to the raw materials or an elimination of the peaks (if necessary, the identification can be made with more certainty by performing the elemental analysis on the product).

The triarylmethane compound of the present invention is a pigment, and this fact significantly contributes to the fastness. If the triarylmethane compound of the present invention is a dye, the excellent technical advantages of the present invention cannot be produced even when the triarylmethane compound is composed of the cation and anion. Moreover, the triarylmethane compound of the present invention is a pigment and may be a hydrate having two to our waters of hydration or may be an anhydride having no water of hydration.

The triarylmethane compound of the present invention is a pigment because it has a lake structure and is insoluble in water. The thus-obtained triarylmethane compound of the present invention can be directly used as a coloring agent for synthetic resin or the like if necessary, by adjusting the particle size through publicly known pulverization or agglomeration, the triarylmethane compound can be used as a coloring agent suitable for various applications. The average particle size of primary particles of the coloring agent is preferably 100 nm or less in the form of dry powder because a clear blue colored product is easily obtained.

In the present invention, the average particle size of primary particles is measured as follows. First, particles in a field of view are micrographed using a transmission electron microscope or a scanning electron microscope. The largest inner diameters (maximum lengths) of 50 primary particles constituting aggregates on a two-dimensional image are determined. The average of the maximum lengths of the 50 particles is defined as the average particle size of primary particles.

The triarylmethane compound of the present invention undergoes only a small change in hue even when having a high-temperature heat history in various known applications and thus has high heat resistance. Therefore, when the triarylmethane compound of the present invention is used for the formation of pixel portions of a color filter, a color filter for a liquid crystal display apparatus that has high brightness, has high heat resistance for maintaining the brightness, and can display a bright image for a long time can be obtained.

In the color filter of the present invention, the backlight source can be selected from a publicly known cold cathode fluorescent lamp (CCFL light source), white color LED (light emitting diode) light source, three color LED light source, and white color organic EL (electro luminescence) light source.

If required, the triarylmethane compound of the present invention may contain a s-type copper phthalocyanine pigment, a dioxazine pigment (C.I. Pigment. Violet 23, C.I. Pigment Violet 37, C. I. Pigment Blue 80, or the like), or the like; an organic pigment derivative such as a sulfonic acid derivative of metal-free or metal phthalocyanine, an N-(dialkylamine)methyl derivative of metal-free or metal phthalocyanine, an N-dialkylaminoalkyl)sulfonic acid amide derivative of metal-free or metal phthalocyanine, a sulfonic acid derivative of dioxazine violet, a sulfonic acid derivative of indanthrene blue, phthalocyanine sulfonic acid, or the like; a dispersant such as BYK Chemie Disperbyk 130, Disperbyk 161, Disperbyk 162, Disperbyk 163, Disperbyk 170, Disperbyk 171, Disperbyk 174, Disperbyk 180, Disperbyk 182, Disperbyk 183, Disperbyk 184, Disperbyk 185, Disperbyk 2000, Disperbyk 2001, Disperbyk 2020, Disperbyk 2050, Disperbyk 2070, Disperbyk 2096, Disperbyk 2150, Disperbyk LPN21116, or Disperbyk LPN6919, Efka Chemicals Company Efka 46, Efka 47, Efka 452, Efka LP4008, Efka 4009, Efka LP4010, Efka LP4050, LP4055, Efka 400, Efka 401, Efka 402, Efka 403, Efka 450, Efka 451, Efka 453, Efka 4540, Efka 4550, Efka LP4560, Efka 120, Efka 150, Efka 1501, Efka 1502, or Efka 1503, Lubrizol Corporation Solsperse 3000, Solsperse 9000, Solsperse 13240, Solsperse 13650, Solsperse 13940, Solsperse 17000, 18000, Solsperse 20000, Solsperse 21000, Solsperse 20000, Solsperse 21000, Solsperse 26000, Solsperse 27000, Solsperse 28000, Solsperse 32000, Solsperse 36000, Solsperse 37000, Solsperse 38000, Solsperse 41000, Solsperse 42000, Solsperse 43000, Solsperse 46000, Solsperse 54000, or Solsperse 71000, or Ajinomoto Co., Ltd. Ajisper PB711, Ajisper PB821, Ajisper PB822, Ajisper PB814, Ajisper PN411, or Ajisper PA111; or a synthetic resin which is liquid and water-insoluble at room temperature, such as an acrylic resin, a urethane resin, an alkyd resin, natural rosin such as wood rosin, gum rosin, tall oil rosin, or the like, modified rosin such as polymerized rosin, disproportionated rosin, hydrogenated rosin, oxidized rosin, maleated rosin, or the like, or a rosin derivative such as rosin amine, lime rosin, a rosin alkyleneoxide adduct, a rosin alkyd adduct, rosin-modified phenol or the like. The addition of such a dispersant or resin contributes to a decrease in flocculation and to improvement in pigment dispersion stability and dispersion viscosity.

The triarylmethane compound of the present invention can be used for formation of pixel portions of a color filter by a publicly known method. A representative example of a method for dispersing the triarylmethane compound of the present invention is a photolithography method. In this method, a photo-curable composition described below is applied onto the surface of a transparent substrate for color filters on the side on which a black matrix has been disposed and dried by heating (pre-baked). Then, pattern exposure is performed through irradiation with ultraviolet rays using a photomask to cure a photo-curable compound in portions corresponding to pixel portions. Subsequently, unexposed portions are developed with a developer to remove non-pixel portions. Thus, the pixel portions are fixed on the transparent substrate. In this method, pixel portions composed of a colored cured film of the photo-curable composition are formed on the transparent substrate.

For each of red, green, and blue colors, the photo-curable composition described below is prepared and the process described above is repeatedly performed. Consequently, a color filter including red, green, and blue colored pixel portions at the predetermined positions can be produced. A blue pixel portion can be formed using the triarylmethane compound of the present invention. A publicly known red pigment and a publicly known green pigment can be used to prepare photo-curable compositions for forming a red pixel portion and a green pixel portion, respectively.

Examples of the pigment for forming a red pixel portion include C.I. Pigment. Red 177, C.I. Pigment. Red 209, C.I. Pigment Red 242, and C.I. Pigment Red 254. Examples of the pigment for forming a green pixel portion include C.I. Pigment Green 7, C.I. Pigment Green 10, C.I. Pigment Green 36, C.I. Pigment Green 47, and C.I. Pigment Green 58. A yellow pigment can also be used for formation of the red pixel portion and the green pixel portion. Then, the entire color filter may be optionally heated (post-baked) in order to heat cure an unreacted photo-curable compound.

The photo-curable composition described below is applied onto a transparent substrate made of glass or the like by, for example, a spin coating method, a roil coating method, or an inkjet method.

The drying conditions of a film of the photo-curable composition applied onto the transparent substrate are dependent on the types of components and the ratio of components added. Normally, the film is dried at 50° C. to 150° C. for about 1 to 15 minutes. Light used for photo curing of the photo-curable composition is preferably ultraviolet rays having a wavelength of 200 to 500 nm or visible light. Various light sources that emit light having such a wavelength can be used.

Examples of the developing method include a puddling method, a dipping method, and a spraying method. After the exposure and development of the photo-curable composition, the transparent substrate on which pixel portions of required colors have been formed is washed with water and dried. The thus-obtained color filter is heated (post-baked) using a heating apparatus such as a hot plate or an oven at 90° C. to 280° C. for the predetermined time. As a result, volatile components in the colored film are removed while at the same time an unreacted photo-curable compound left in the colored cured film of the photo-curable composition is heat cured. Thus, a color filter is completed.

The photo-curable composition used for forming a blue pixel portion of the color filter contains, as essential components, the triarylmethane compound of the present invention, a dispersant, a photo-curable compound, and an organic solvent. The photo-curable composition can be prepared by mixing these components and optionally a thermoplastic resin with each other. In the case where the colored resin film that forms a blue pixel portion needs to have high toughness so that the colored resin film can endure the baking performed in the actual production of a color filter, when the photo-curable composition is prepared, the thermoplastic resin needs to be added together with the photo-curable compound. If the thermoplastic resin is added together, an organic solvent that can dissolve the thermoplastic resin is preferably used.

The photo-curable composition is generally produced as follows. The triarylmethane compound of the present invention, an organic solvent, and a dispersant, which are essential components, are stirred and dispersed so as to be uniformly mixed with each other, whereby a pigment dispersion liquid for forming a pixel portion of a color filter is prepared. Then, a photo-curable compound and optionally a thermoplastic resin and a photoinitiator are added to the pigment dispersion liquid to produce the photo-curable composition.

Herein, the above-described dispersants and organic solvents can be used.

Examples of the thermoplastic resin used to prepare the photo-curable composition include urethane resin, acrylic resin, polyamide resin, polyimide resin, styrene-maleic resin, and styrene-maleic anhydride resin.

Examples of the photo-curable compound include difunctional monomers such as 1,6-hexanediol diacrylate, ethylene glycol diacrylate, neopentyl glycol diacrylate, triethylene glycol diacrylate, bis(acryloxyethoxy)bisphenol A, and 3-methylpentahediol diacrylate; polyfunctional monomers having relatively low molecular weight, such as trimethylolpropane triacrylate, pentaerythritol triacrylate, tris[2-(meth) acryloyloxyethyl) isocyanurate, dipentaerythritol hexaacrylate, and dipentaerythritol pentaacrylate; and polyfunctional monomers having relatively high molecular weight, such as polyester acrylate, polyurethane acrylate, and polyether acrylate.

Examples of the photoinitiator include acetophenone, benzophenone, benzyldimethyl ketanol, benzoyl peroxide, 2-chlorothioxanthone, 1,3-bis(4'-azidobenzal)-2-propane, 1,3-bis(4'-azidobenzal)-2-propane-2'-sulfonic acid, and 4,4'-diazidostilbene-2,2'-disulfonic acid. Examples of a commercially available photoinitiator include "Irgacure (trademark)-184", "Irgacure (trademark)-369", and "Darocur (trademark)-1173" manufactured by Ciba Specialty Chemicals Inc.; "Lucirin-TPO" manufactured by BASF; "Kayacure (trademark) DETX" and "Kayacure (trademark) OA" manufactured by Nippon Kayaku Co., Ltd.; "Vicure 10" and "Vicure 55" manufactured by Stauffer; "Trigonal PI" manufactured by Akzo; "Sandorei 1000" manufactured by Sandoz; "DEAP" manufactured by Upjohn Co.; and "Biimidazole" manufactured by Kurogane Kasei. Co., Ltd.

A publicly known photosensitizer can also be used together with the photoinitiator. Examples of the photosensitizer include amines, urea compounds, compounds containing a sulfur atom, compounds containing a phosphorus atom, compounds containing a chlorine atom, nitriles, and other compounds containing a nitrogen atom. They may be used alone or in combination of two or more.

The ratio of the photoinitiator added is not particularly limited, but is preferably 0.1% to 30% by mass relative to the photo-curable compounds or compounds having a photo-curable functional group. If the ratio is less than 0.1%, the sensitivity during photocuring tends to decrease. If the ratio is more than 30%, a crystal of the photoinitiator is precipitated when a pigment dispersion resist film is dried and thus the physical properties of the film may be degraded.

Using the materials described above, 300 to 1000 parts by mass of the organic solvent and 1 to 100 parts by mass of the dispersant relative to 100 parts by mass of the triarylmethane compound of the present invention are stirred and dispersed so as to be uniformly mixed with each other. Thus, the pigment dispersion liquid can be prepared. Subsequently, 3 to 20 parts by mass of the thermoplastic resin and photo-curable compound in total relative to 1 part by mass of the triarylmethane compound of the present invention, 0.05 to 3 parts by mass of the photoinitiator relative to 1 part by mass of the photo-curable compound, and optionally an organic solvent are added to the pigment dispersion liquid and stirred and dispersed so as to be uniformly mixed with each other. Thus, a photo-curable composition for forming a pixel portion of a color filter can be prepared.

A publicly known organic solvent or aqueous alkali solution can be used as the developer. In particular, in the case where the photo-curable composition contains a thermoplastic resin or a photo-curable compound and at least one of the thermoplastic resin and photo-curable compound has an acid value and exhibits alkali solubility, washing with an aqueous alkali, solution is effective for the formation of pixel portions of a color filter.

Regarding the pigment dispersion method, a method for forming pixel portions of a color filter by photolithography has been described in detail. When the pigment composition for color filters of the present invention is used, the blue pixel portion may be formed by another method such as an electrodeposition method, a transfer method, a micelle electrolysis method, a photovoltaic electrodeposition method, an inkjet method, a reverse printing method, or a heat curing method to produce a color filter.

A color filter can be produced by the following method. Photo-curable compositions for three colors are prepared using, as organic pigments, a red pigment, a green pigment, and the triarylmethane compound of the present invention. A liquid crystal material is sealed between a pair of transparent electrodes disposed in parallel with each other, and the transparent electrodes are divided into discontinuous minute sections. Using the photo-curable compositions, red, green, and blue pixel portions of a color filter are alternately formed in a pattern in the corresponding minute sections divided in a grid-like manner with a black matrix. Alternatively, pixel portions of a color filter are formed on a substrate and then transparent substrates are disposed thereon.

The triarylmethane compound of the present invention can provide a coloring pigment dispersion having excellent clearness and brightness and can be applied to paint, plastics (resin molded products), printing ink, rubber, leather, textile printing, toner for developing an electrostatic charge image, inkjet recording ink, and thermal transfer ink, in addition to color filters, for the purpose of coloring.

The present invention will now be described in detail based on Examples, but is obviously not limited to the scope of Examples. Note that "part", "%", and "ppm" are on a mass basis unless otherwise specified.

Example 1

<Synthesis of Triarylmethane Compound Formed into Lake with Keggin-Type $(SiMoW_{11}O_{40})^{4-}$ Heteropolyoxpmetalate>

(1) Preparation of $K_4(SiMoW_{11}O_{40})$

Into 9.8 ml of 13 mol/l aqueous $HNO_3$ solution, 16.4 ml of 1 mol/l aqueous $Na_2MoO_4$ solution was added and stirred. Then, 16.4 g of $K_8(\alpha\text{-}SiW_{11}O_{39}).13H_2O$ prepared by a method described in Inorganic Synthesis vol. 27 p. 85 was gradually added to the solution above. After stirring was performed at room temperature for four hours, 26 ml of saturated aqueous KCl solution was added thereto to generate a precipitate. The generated precipitate was filtered and washed with a saturated aqueous KCl solution. The obtained solid was dried under reduced pressure at room temperature. The yield was 12.2 g.

Analysis ($KBr/cm^{-1}$) with Fourier transform infrared spectrophotometer (FT-IR): 1018, 978, 924, 876, 779, 539

Elemental analysis (N, Mo, K, and Si elemental analysis) was performed by an emission spectroscopic analysis method using inductively coupled plasma (ICP) as a light source.

W, Mo, K, and Si elemental analysis (values in the table are on a mass % basis, and this applies to each table):

TABLE 1

|  | K | Si | Mo | W |
| --- | --- | --- | --- | --- |
| Calcd. | 5.2 | 0.9 | 3.2 | 67.1 |
| Found | 5.2 | 0.9 | 2.9 | 68 |

It was found that the obtained product had the following composition.

Calcd.: $K_4(Si_1Mo_1W_{11}O_{40})\text{-}4.0H_2O$

As a result of FT-IR analysis and W, Mo, K, and Si elemental analysis, it was confirmed that the dried product was $K_4(SiMoW_{11}O_{40})$.

(2) Production of Keggin-Type $(SiMoW_{11}O_{40})$ Triarylmethane Compound

First, 6.46 g of C.I. Basic Blue 7 (reagent manufactured by TOKYO CHEMICAL INDUSTRY Co., Ltd.) was added to 390 ml of purified water and dissolved therein under stirring at 40° C. Then, 12.2 g of $K_4(SiMoW_{11}O_{40})$ prepared by the above-described method was dissolved in 50 ml of purified water. The $K_4(SiMoW_{11}O_{40})$ solution was added to the C.I. Basic Blue 7 solution and stirred at 40° C. for one hour. The temperature of the mixture was increased to 80° C., and the mixture was stirred at that temperature for one hour to form a lake. After cooling, the lake was filtered and washed with 300 ml of purified water three times. By drying the obtained solid at 90° C., 13.4 g of a dark blue solid was obtained. The average particle size of primary particles of the solid product was 50 nm. The solid product was pulverized with a commercially available juicer and analyzed with infrared rays in the same manner as that described above.

The obtained triarylmethane lake pigment was subjected to Fourier transform infrared spectroscopic analysis, elemental analysis (CHN elemental analysis) performed by a thermal conductivity method, and elemental analysis (W, Mo, K, and Si elemental analysis) performed by an emission spectroscopic analysis method using inductively coupled plasma (ICP) as a light source. The results are shown below.

Analysis (KBr/cm$^{-1}$) with Fourier transform infrared spectrophotometer (FT-IR): 2970, 1579, 1413, 1343, 1274, 1185, 1155, 1074, 966, 918, 795

CHN elemental analysis and W, Mo, K, and Si elemental analysis:

TABLE 2

|  | C | H | N | K | Si | W | Mo |
|---|---|---|---|---|---|---|---|
| Calcd. | 32.8 | 3.5 | 3.5 | 0.1 | 0.6 | 42.9 | 2.0 |
| Found | 32.7 | 3.3 | 3.5 | 0.1 | 0.6 | 43.1 | 1.8 |

It was found that the obtained product had the following composition.

Calcd. $(C_{33}H_4O_1N_3)_{3.9}K_{0.1}(Si_1Mo_1W_{11}O_{40})\cdot 3.0H_2O$

From the FT-IR analysis results of the C.I. Basic Blue 7 itself, the $K_4(SiMoW_{11}O_{40})$ itself, and the above product, it was confirmed that, in the above product, the cation structure of C.I. Basic Blue 7 and the anion structure of $K_4(SiMoW_{11}O_{40})$ were maintained.

From the results of the elemental analyses, it was confirmed that, in the above product, the cation structure of C.I. Basic Blue 7 was substituted with K of $K_4(SiMoW_{11}O_{40})$ and formed an ionic bond with the anion structure. This is obvious because the content of potassium (K) was sufficiently low.

From these facts, the obtained product was identified as a triarylmethane compound constituted by the cation and the anion in general formula (I), where $R^1$, $R^2$, and $R^3$ are each an ethyl group, $R^4$ is a hydrogen atom, and $X^-$ is a Keggin-type polyoxometalate represented by $(SiMoW_{11}O_{40})^{4-}/4$.

Example 2

Into a plastic bottle, 1.80 parts of the triarylmethane compound obtained in Example 1, 2.10 parts of BYK-2164 (BYK Japan KK), 11.10 parts of propylene glycol monomethyl ether acetate, and 0.3 to 0.4 mmφ Sear beads were inserted, and they were dispersed with a paint conditioner (manufactured by Toyo Seiki Seisaku-sho, Ltd.) for four hours to obtain a pigment dispersion liquid. Then, 75.00 parts of the pigment dispersion liquid, 5.50 parts of polyester acrylate resin (Aronix (trademark) M7100 manufactured by TOAGOSEI CO., LTD.), 5.00 parts of dipentaerythritol hexaacrylate (KAYARAD (trademark) DPHA manufactured by Nippon Kayaku Co., Ltd.), 1.00 part of benzophenone (KAYACURE (trademark) BP-100 manufactured by Nippon Kayaku Co., Ltd.), and 13.5 parts of UCAR Ester EEP (manufactured by Union Carbide Corporation) were stirred with a mixer and filtered with a filter having a pore size of 1.0 μm to obtain a color resist (photo-curable composition). The color resist was applied onto a thick glass having a size of 50 mm×50 mm×1 mm using a spin coater so chat the dry film thickness was 2 μm. Subsequently, the color resist was subjected to preliminary drying at 90° C. for 20 minutes to form a film. Thus, a color filter including a blue pixel portion was produced.

Comparative Example 1

A color filter including a blue pixel portion was produced in the same manner as in Example 2, except that FANAL BLUE D6340 (the anion is Keggin-type phosphotungstomolybdate) manufactured by BASF was used in the same amount instead of the triarylmethane compound obtained in Example 1.

Regarding the color filters of Example 2 and Comparative Example 1, the degrees of changes in hue and brightness between just after preparation (before irradiation with light) and after irradiation with light were determined as follows.

<Light Resistance Test>

Each of the blue color filters produced above was irradiated with light using a xenon lightfastness tester (Suntest CPS+ manufactured by Atlas) under the conditions 550 W/m$^2$, 63° C., and 48 hours. The hue and brightness before and after the irradiation were measured with Spectrophotometer CM-3500d manufactured by Konica Minolta Optics, Inc. to perform comparison in terms of the color difference ΔE*ab and the change in brightness. Table 3 shows the results.

TABLE 3

|  | Lake anon (X$^-$) | Brightness before irradiation | Brightness after irradiation | ΔE * ab |
|---|---|---|---|---|
| Example 2 | $(SiMoW_{11}O_{40})^{4-}$ | 15.75 | 12.07 | 8.83 |
| Comparative Example 1 | Keggin-type phosphotungstomolybdate | 15.77 | 12.89 | 8.09 |

<Heat Resistance Test>

The blue color filters of Example 2 and Comparative Example 1 were inserted into an oven at 210° C. for three hours. The hue and brightness before and after the heating were measured with Spectrophotometer CM-3500d manufactured by Konica Minolta Optics, Inc. to perform comparison in terms of the color difference ΔE*ab and the change in brightness. Table 4 shows the results.

TABLE 4

|  | Lake anion (X$^-$) | Brightness before post-baking | Brightness after post-baking | ΔE * ab |
|---|---|---|---|---|
| Example 2 | $(SiMoW_{11}O_{40})^{4-}$ | 15.71 | 14.23 | 3.48 |
| Comparative Example 1 | Keggin-type phosphotungstomolybdate | 15.78 | 0.28 | 21.36 |

As is clear from Table 3, the triarylmethane compound of the present invention has light resistance equivalent to that of a known triarylmethane compound. However, it is found from Table 4 that, even if the cation structures derived from a dye are the same, the heat resistances are significantly different from each other depending on the types of lake anions. It is also found that the blue pixel portion of a color filter containing the triarylmethane compound of the present invention has high brightness at the initial stage and furthermore has substantially the same brightness as at the initial stage even when having a high-temperature heat history.

Accordingly, there can be provided a liquid crystal display apparatus or the like that has light resistance equivalent to the light resistance provided by a known triarylmethane compound and that can perform high-brightness liquid crystal display for a long time even at high temperature.

INDUSTRIAL APPLICABILITY

Because of the exceptional heat resistance of the triarylmethane compound of the present invention, there can be provided a colored product that has light resistance equivalent to the light resistance provided by a known triarylmethane compound and that undergoes only a small change in hue over a long period of time even when having a high-temperature heat history. In particular, when the triarylmethane compound is used for forming a blue pixel portion of a color filter, there can be provided a liquid crystal display apparatus that has light resistance equivalent to the light resistance provided by a known triarylmethane compound and that can perform high-brightness liquid crystal display for a long time even at high temperature.

The invention claimed is:

1. A compound represented by general formula (I) below:

[Chem. 1]

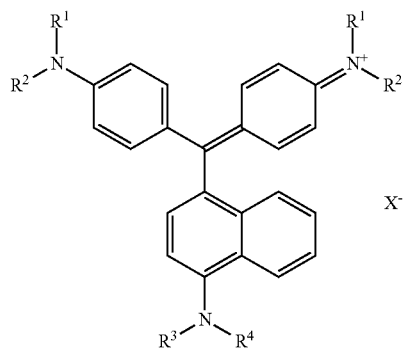

(I)

[wherein, in general formula (I), $R^1$, $R^2$, $R^3$, and $R^4$ may be the same or different from each other and are each a hydrogen atom, an alkyl group having 1 to 3 carbon atoms, or a phenyl group; and $X^-$ is a heteropolyoxometalate anion represented by $(SiMoW_{11}O_{40})^{4-}/4$.]

2. The compound represented by general formula (I) according to claim 1, wherein $R^1$, $R^2$, and $R^3$ are each an ethyl group and $R^4$ is a hydrogen atom.

3. A color filter comprising, the compound according to claim 1 in a blue pixel portion.

4. A color filter comprising the compound according to claim 2 in a blue pixel portion.

* * * * *